(12) United States Patent
Dachs et al.

(10) Patent No.: US 7,995,633 B2
(45) Date of Patent: Aug. 9, 2011

(54) METHOD FOR PRODUCING A SEMICONDUCTOR LASER, AND SEMICONDUCTOR LASER

(75) Inventors: Juergen Dachs, Baar-Ebenhausen (DE); Stefan Illek, Donaustauf (DE); Roland Schulz, Regensburg (DE); Thomas Schwarz, Regensburg (DE); Frank Singer, Regenstauf (DE); Heiko Unold, Neutraubling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 106 days.

(21) Appl. No.: 12/371,292

(22) Filed: Feb. 13, 2009

(65) Prior Publication Data

US 2009/0232177 A1 Sep. 17, 2009

(30) Foreign Application Priority Data

Feb. 14, 2008 (DE) .................. 10 2008 009 108

(51) Int. Cl.
*H01S 5/00* (2006.01)
*H01L 21/00* (2006.01)
(52) U.S. Cl. ...................... 372/43.01; 438/22
(58) Field of Classification Search ............... 372/34, 372/36, 43.01; 438/22; 257/E25.001
See application file for complete search history.

(56) References Cited

U.S. PATENT DOCUMENTS

| | | | |
|---|---|---|---|
| 6,474,531 B2 * | 11/2002 | Ozawa | 228/103 |
| 6,680,959 B2 | 1/2004 | Tanabe et al. | |
| 7,144,800 B2 * | 12/2006 | Mostafazadeh et al. | 438/598 |
| 7,329,587 B2 * | 2/2008 | Bruederl et al. | 438/458 |
| 2005/0224783 A1 | 10/2005 | Matsuyama et al. | |
| 2005/0282373 A1 * | 12/2005 | Bader et al. | 438/604 |
| 2006/0189098 A1 * | 8/2006 | Edmond | 438/460 |
| 2009/0262771 A1 * | 10/2009 | Inoue et al. | 372/45.01 |

FOREIGN PATENT DOCUMENTS

| | | |
|---|---|---|
| DE | 10 2005 053 274 | 4/2007 |
| DE | 10 2006 017 293 | 7/2007 |
| DE | 10 2006 017 294 | 7/2007 |
| DE | 10 2006 033 502 | 11/2007 |

(Continued)

OTHER PUBLICATIONS

DIN 50411-1/-5: "Dicke und Dickenvariation", Deutsches Institut fur Normung e.V., Jul. 1996. Apr. 2001, Beuth Verlag GmbH.

(Continued)

*Primary Examiner* — Minsun Harvey
*Assistant Examiner* — Phillip Nguyen
(74) *Attorney, Agent, or Firm* — Cohen Pontani Lieberman & Pavane LLP (57) ABSTRACT

A method for producing a multiplicity of semiconductor lasers (100) comprising the steps of providing a carrier wafer (30), producing an assembly (70) by applying a multiplicity of semiconductor laser chips (4) to a top side (31) of the carrier wafer (30), and singulating the assembly (70) to form a multiplicity of semiconductor lasers (100). Each semiconductor laser (100) comprises a mounting block (3) and at least one semiconductor laser chip (4). Each mounting block (3) has a mounting area (13) which runs substantially perpendicular to a top side (12) of the mounting block (3), on which top side the semiconductor laser chip (4) is arranged. The mounting area (13) is produced during the singulation of the assembly.

16 Claims, 7 Drawing Sheets

FOREIGN PATENT DOCUMENTS

| WO | WO 02/067393 | 8/2002 |
| WO | WO 2006/032252 | 3/2006 |
| WO | WO 2007/076841 | 7/2007 |
| WO | WO 2007/076845 | 7/2007 |
| WO | WO 2007/124737 | 11/2007 |

OTHER PUBLICATIONS

""Stealth Dicing" technology: Enabling complete dry cutting processes", http://jp.hamamatsu.com/en/rd/technology/industry/stealth_dicing.html.

* cited by examiner

METHOD FOR PRODUCING A SEMICONDUCTOR LASER, AND SEMICONDUCTOR LASER

RELATED APPLICATIONS

This patent application claims the priority of German patent application 10 2008 009 108.1 filed Feb. 14, 2008, the disclosure content of which is hereby incorporated by reference.

FIELD OF THE INVENTION

A method for producing a multiplicity of semiconductor lasers is specified.

SUMMARY OF THE INVENTION

One object of the present invention is to provide a method which makes it possible to produce particularly compact semiconductor lasers in large numbers. A further object is to provide a particularly compact semiconductor laser.

In accordance with at least one embodiment of the method, the method comprises a method step which involves providing a carrier wafer. The carrier wafer is a wafer which serves as a carrier for components to be applied to the wafer. The carrier wafer has a top side and an underside. In this case, the top side and underside are formed by main extension planes of the carrier wafer. The carrier wafer is distinguished by the fact that the top side and underside run substantially parallel to one another. "Substantially parallel to one another" means that the deviation from a plane-parallel course is at most 0.5 degree, preferably at most 0.3 degree, particularly preferably at most 0.1 degree.

In accordance with at least one embodiment of the method for producing a multiplicity of semiconductor lasers, the method has a method step which involves producing an assembly by applying a multiplicity of semiconductor laser chips to the top side of the carrier wafer. In this case, the multiplicity of semiconductor laser chips is preferably mechanically fixedly connected to the carrier wafer. The semiconductor laser chips are preferably optically pumpable semiconductor laser chips. That is to say that, during operation of the semiconductor laser chips, the latter are optically pumped by an external or internal pump source, such that electromagnetic radiation is generated by the semiconductor laser chips. In this case, the semiconductor laser chips preferably have at least one reflective layer sequence—preferably a Bragg mirror—which serves as a resonator mirror.

The document WO 02/067393, for example, describes a surface emitting semiconductor laser chip with integrated pump radiation source.

In accordance with at least one embodiment of the method for producing a multiplicity of semiconductor lasers, the method has a method step according to which the assembly comprising semiconductor laser chips and carrier wafer is singulated to form a multiplicity of semiconductor lasers. The assembly can be singulated by a separating method such as, for example, a laser separating method or wafer sawing. Each of the multiplicity of semiconductor lasers comprises a mounting block and at least one semiconductor laser chip applied to the mounting block. The mounting block is formed from a part of the original carrier wafer which is produced by the singulation of the assembly. In other words, the mounting block is also distinguished by the fact that its top side and its underside run substantially plane-parallel to one another. In this case, the top side of the mounting block is that side to which the semiconductor laser chip or semiconductor laser chips is or are applied. By way of example, precisely one semiconductor laser chip is applied to each mounting block.

Furthermore, each mounting block has a mounting area. The mounting area runs substantially perpendicular to the top side of the mounting block. In this case, "substantially perpendicular" means that the angle between top side and mounting area has an angle error of at most 0.5 degree, preferably at most 0.4 degree, particularly preferably at most 0.3 degree. In this case, such a small angle error is realized by the mounting area being produced during the singulation of the assembly comprising carrier wafer and a multiplicity of semiconductor laser chips. This means that the mounting area of the mounting block is provided by an area along which the carrier wafer was singulated. The mounting area can therefore have singulation traces. With the mounting area, the mounting carrier can be mounted for example onto a module carrier.

In accordance with at least one embodiment of the method for producing a multiplicity of semiconductor lasers, the method has the following method steps:

a) providing a carrier wafer,
b) producing an assembly by applying a multiplicity of semiconductor laser chips to a top side of the carrier wafer,
c) singulating the assembly to form a multiplicity of semiconductor lasers, wherein
each semiconductor laser comprises a mounting block and at least one semiconductor laser chip,
each mounting block has a mounting area which runs substantially perpendicular to a top side of the mounting block, on which top side the semiconductor laser chip is arranged, and
the mounting area is produced during the singulation of the assembly.

The method described here also makes it possible to produce other optoelectronic semiconductor components such as light emitting diodes or photodiodes, instead of a semiconductor laser. In other words, the method described is generally disclosed for production of optoelectronic semiconductor components. In one embodiment, the method can then have the following steps:

a) providing a carrier wafer,
b) producing an assembly by applying a multiplicity of semiconductor chips to a top side of the carrier wafer,
c) singulating the assembly to form a multiplicity of optoelectronic semiconductor components, wherein
each semiconductor component comprises a mounting block and at least one semiconductor chip,
each mounting block has a mounting area which runs substantially perpendicular to a top side of the mounting block, on which top side the semiconductor chip is arranged, and
the mounting area is produced during the singulation of the assembly.

The semiconductor chips can then be light emitting diode chips or photodiode chips, for example.

In accordance with at least one embodiment of the method described here, the carrier wafer contains or consists of one of the following materials: semiconductor material, ceramic material. Preferably, the carrier wafer consists of a nonmetallic material. By way of example, the carrier wafer consists of silicon or aluminum nitride (AlN). In this case, it proves to be particularly advantageous for the method if the carrier wafer consists of a semiconductor material and/or of a ceramic material, since such materials can be separated particularly well in semiconductor processes. In this way, a multiplicity of semiconductor lasers can be produced in a simple manner by singulating the carrier wafer. In the production of a multiplicity of semiconductor lasers, the described materials for the carrier wafer prove to be particularly advantageous by comparison with a carrier wafer which consists of metal, for example, since such a metal wafer can be singulated only with difficulty or not at all in the manner described.

Furthermore, angle-precise separating techniques such as, for example, laser separating methods or wafer sawing exist for the materials described. If appropriate, after singulation, the mounting areas of the mounting blocks produced can be polished in order to produce as far as possible a precise 90 degrees angle between the top side of the mounting block and the mounting area. Furthermore, large carrier wafers having high plane-parallelism between their top side and underside can be produced from the described nonmetallic materials such as semiconductor material and ceramic material. The use of a carrier wafer furthermore enables the method to be carried out in the panel. Production "in the panel" means here that a multiplicity of identical semiconductor lasers are produced on one and the same carrier wafer.

In accordance with at least one embodiment of the method for producing a multiplicity of semiconductor lasers, the semiconductor laser chips are applied individually to the top side of the carrier wafer in the course of producing the assembly of the multiplicity of semiconductor laser chips and the carrier wafer. In other words, the semiconductor laser chips have already been singulated prior to being applied to the carrier wafer and are applied to the carrier wafer at locations provided for them. In this case, the semiconductor laser chips are preferably positioned at grid points of a regular grid, such that a regular pattern of semiconductor laser chips arises on the top side of the carrier wafer. By way of example, the semiconductor laser chips are positioned at the grid points of an imaginary rectangular grid, such that the semiconductor laser chips are arranged in the manner of a matrix in rows and columns on the top side of the carrier wafer.

In accordance with an alternative method step, the semiconductor laser chips are applied to the top side of the carrier wafer in the wafer assembly in the course of producing the assembly comprising the multiplicity of semiconductor laser chips and the carrier wafer. "In the wafer assembly" means here that the semiconductor laser chips have not yet been singulated, but rather are for example still situated in the wafer assembly in which they were produced. In this case, the wafer assembly can comprise for example a substrate wafer onto which a layer sequence comprising the laser-active layer is deposited epitaxially. In this case, the wafer assembly of semiconductor laser chips preferably has approximately the same form and size as the carrier wafer. In this way, the assembly comprising the multiplicity of semiconductor laser chips and the carrier wafer can be produced by carrier wafer and wafer assembly being placed one above the other and connected.

In accordance with at least one embodiment of the method described here, the growth substrate is removed from the semiconductor laser chips after the wafer assembly has been applied. In this embodiment, the semiconductor laser chips are so-called "bottom emitter" structures. The growth substrate is removed on that side of the wafer assembly of the semiconductor laser chips which is opposite to the carrier wafer, such that the semiconductor laser chips are present as thin-film semiconductor laser chips. As an alternative to completely removing the growth substrate, it is also possible for the growth substrate to be thinned or to be removed only in places. If the growth substrate is removed only in places, it is preferably removed where laser radiation emerges from the semiconductor laser chips during operation.

In accordance with at least one embodiment of the method, prior to producing the assembly, for each semiconductor laser chip, a contact metallization is applied on the top side of the carrier wafer. The contact metallization can be rectangular TiPtAu contact areas, for example. In this case, it is also possible for a contact metallization to be applied to the top side of the carrier wafer over the whole area and for a structuring of the contact metallization into individual contact areas to be effected only as a result of singulating the assembly to form a multiplicity of semiconductor lasers.

In accordance with at least one embodiment of the method, prior to producing the assembly, for each semiconductor laser chip, a heat sink is applied to the top side of the carrier wafer. The heat sink contains or consists for example of one of the following materials: AlN, SiC, diamond, copper.

In this case, the heat sink improves the dissipation of the heat generated during operation from the semiconductor laser chip. The semiconductor laser chip is then applied to that surface of the heat sink which is remote from the carrier wafer. In this case, it is also possible for a heat sink wafer to be applied to the top side of the carrier wafer over a large area and for individual heat sinks to be produced only with the singulation of the assembly to form individual semiconductor laser chips.

Furthermore, a semiconductor laser is specified.

In accordance with at least one embodiment of the semiconductor laser, the semiconductor laser comprises a mounting block. The mounting block is a carrier on which at least one semiconductor laser chip is applied. The mounting block comprises a top side and a mounting area. At least one semiconductor laser chip is applied to the top side of the mounting block. In this case, the mounting area runs substantially perpendicular to the top side of the mounting block. In this case, "substantially perpendicular" means that the angle between top side and mounting area has an angle error of at most 0.5 degree, preferably at most 0.4 degree, particularly preferably at most 0.3 degree.

In accordance with at least one embodiment of the semiconductor laser, the mounting area is produced by a singulation process. In other words, the mounting area is produced by singulating a larger structure—for instance a carrier wafer—to form the mounting block. The mounting area therefore has singulation traces. In other words, the mounting area is not produced by some other shaping process such as epitaxial growth, injection molding methods or transfer molding methods, but rather is produced by a singulation process such as sawing or laser separation.

In accordance with at least one embodiment of the semiconductor laser, the semiconductor laser comprises a mounting block having a top side and a mounting area. Furthermore, the semiconductor laser comprises at least one semiconductor laser chip arranged on the top side of the mounting block. In this case, the mounting area runs substantially perpendicular to the top side of the mounting block and the mounting area is produced by a singulation process.

In accordance with at least one embodiment of the semiconductor laser, the semiconductor laser can be produced or is produced by a method as described in conjunction with at least one embodiment of the methods described here for producing a multiplicity of semiconductor lasers.

In accordance with at least one embodiment of the semiconductor laser, the mounting block contains or consists of a nonmetallic material such as, for instance, one of the following materials: semiconductor material, ceramic material. In this case, the mounting block consists for example of silicon or aluminum nitride.

In accordance with at least one embodiment of the semiconductor laser, the mounting block has a substantially uniform thickness. In this case, the thickness of the mounting block is the distance from its top side, to which the semiconductor laser chip is applied, to its underside arranged opposite the top side. The top side and underside preferably run parallel or substantially parallel in such a way that the deviation from a parallel course is at most 0.5 degree, preferably at most 0.3 degree, particularly preferably at most 0.1 degree.

In this case, the thickness is preferably at least 0.5 mm and at most 1.7 mm, particularly preferably at least 0.6 mm and at most 1.5 mm.

BRIEF DESCRIPTION OF THE DRAWINGS

The method described here and also the semiconductor laser described here are explained in more detail below on the basis of exemplary embodiments and the associated figures.

DETAILED DESCRIPTION OF THE DRAWINGS

In the exemplary embodiments and figures, identical or identically acting constituent parts are in each case provided with the same reference symbols. The elements illustrated should not be regarded as true to scale; rather, individual elements may be illustrated with an exaggerated size in order to afford a better understanding.

FIGS. 1A to 1D show, in schematic perspective illustrations, a first exemplary embodiment of a method for producing a multiplicity of semiconductor lasers described here.

Figure 1A:
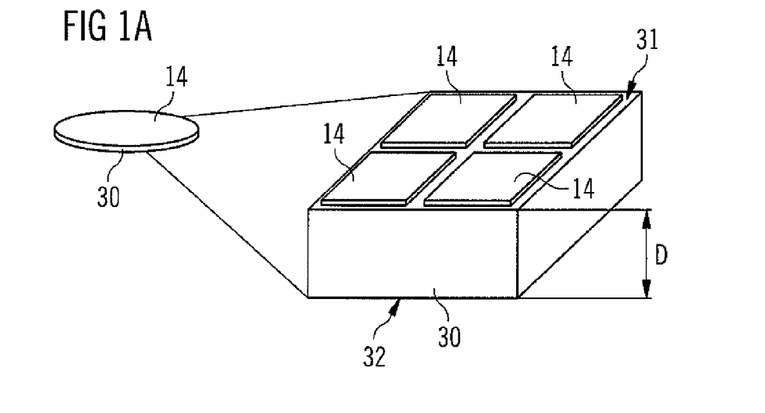
FIGS. 1A to 1D show, in schematic perspective illustrations, a first exemplary embodiment of a method for producing a multiplicity of semiconductor lasers described here.

FIG. 1A shows, in a schematic perspective illustration, a first method step for producing a multiplicity of semiconductor lasers. In this first method step, firstly a carrier wafer 30 is provided. The carrier wafer 30 consists of silicon or aluminum nitride. The carrier wafer 30 has a uniform thickness D. In this case, the thickness preferably lies between 0.6 mm and 1.5 mm. The carrier wafer comprises a top side 31 and an underside 32. The top side 31 and underside 32 of the carrier wafer 30 run substantially plane-parallel to one another. In other words, the deviation from plane-parallelism is preferably less than 0.1 degree. In this case, FIG. 1A shows on the left the entire carrier wafer and on the right an enlarged illustration of an excerpt from the carrier wafer.

A contact metallization 14 formed by rectangular TiPtAu contact areas is applied to the top side 31 of the carrier wafer. The contact metallization serves for subsequent mechanical fixing of semiconductor laser chips.

Figure 1B:
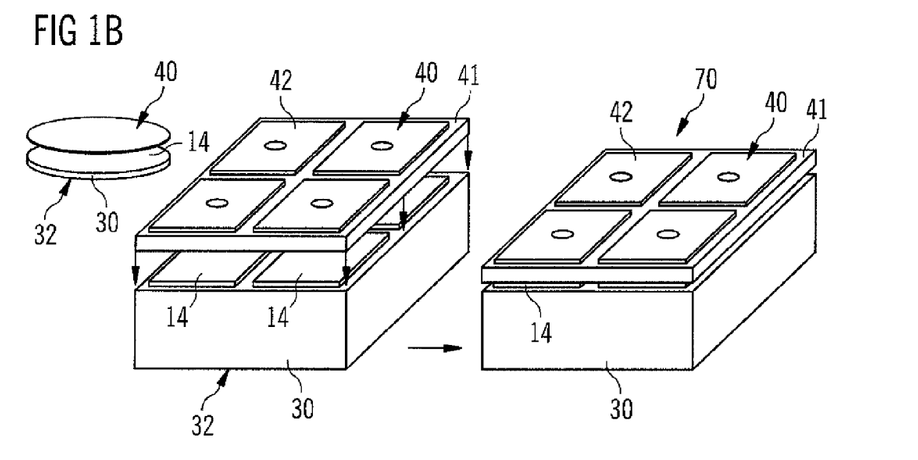

A further method step for producing a multiplicity of semiconductor lasers in accordance with the first exemplary embodiment is described on the basis of schematic perspective drawings in conjunction with FIG. 1B. In this method step, a wafer assembly 40 of semiconductor laser chips 4 is applied to the carrier wafer 30. In this case, the wafer assembly 40 has a solder metallization, which is not illustrated in the figures, on its side facing the carrier wafer 30.

An AuSn solder, for example, can be used as solder metallization. However, other solder materials are also conceivable. Furthermore, alternative connecting techniques such as adhesive bonding are possible for connecting semiconductor laser chips 4 and carrier wafer 30.

In this case, the wafer assembly 40 of semiconductor laser chips consists for example of a growth substrate 41 to which epitaxially deposited layers 42 are applied. In this case, the epitaxially deposited layers 42 comprise, inter alia, active layers suitable for generating laser radiation.

The wafer assembly is applied to the carrier wafer 30 with an accuracy of a few micrometers. The solder metallization of the wafer assembly is subsequently soldered to the contact metallization 14, thus producing a mechanically fixed connection, that is to say an assembly 70 of wafer assembly 40 and carrier wafer 30.

Preferably, an adhesive film clamped in a frame is applied to the underside 32 remote from the wafer assembly 40—of the carrier wafer 30. The adhesive film is, for example, a self-adhesive foil which is bonded to the underside 32 of the carrier wafer 30. The edge of this foil can be clamped in a frame. After singulation of the assembly to individual chips (see below) the foil is expanded in that the foil is pulled apart in different directions. In this way the distance between the individual chips (which are bonded to the foil) is enlarged.

Figure 1C:
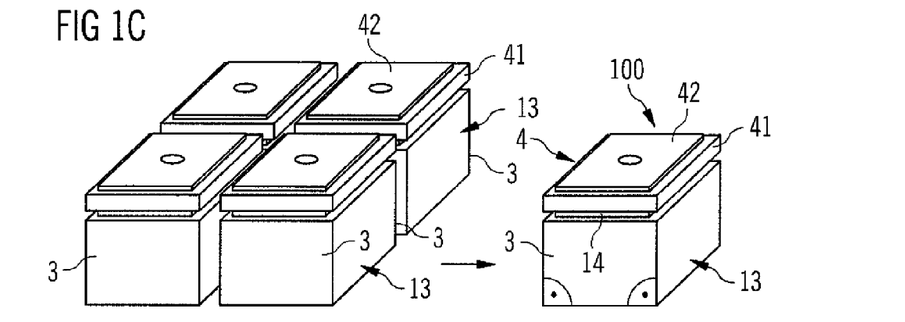

A further method step of the method in accordance with the first exemplary embodiment is described in a schematic perspective illustration in conjunction with FIG. 1C. In this method step, the assembly comprising wafer assembly 40 and carrier wafer 30 is singulated to form individual semiconductor lasers 100 comprising a mounting block and a semiconductor laser chip 4. The singulation can be effected for example by a laser separating method or wafer sawing. After the sawing, the film to which the assembly 70 is applied is expanded. In this way, the individual chips separate from one another along the singulation lines. Mounting areas 13 of individual mounting blocks 3 are produced by the singulation. On account of the material used for the carrier wafer 30 and the singulation process used, the mounting areas 13 are formed in very planar fashion and have at most a small angle error relative to the perpendicular to the top side of the mounting block 3. The angle error is less than 0.3 degree in this case.

Figure 1D:
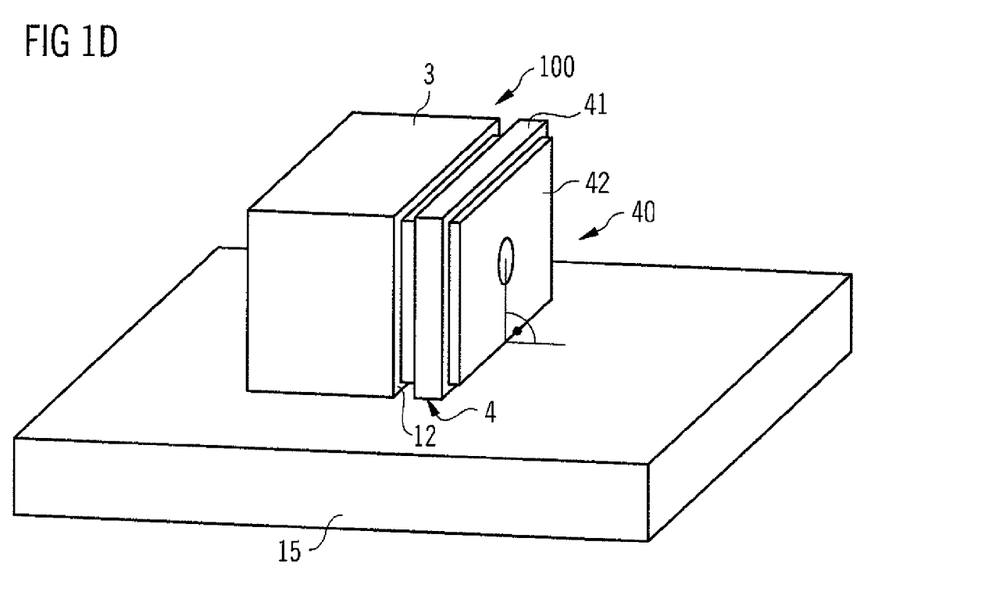

FIG. 1D shows, in a schematic perspective illustration, a semiconductor laser 100 produced in accordance with the first exemplary embodiment, said semiconductor laser being mounted by its mounting area 13 onto a module carrier 15. As can be seen from FIG. 1D, the top side—remote from the module carrier 3—of the semiconductor laser chip 4 and the mounting area of the module carrier 15 form a right angle with one another, on account of the small angle error.

Figure 2A:
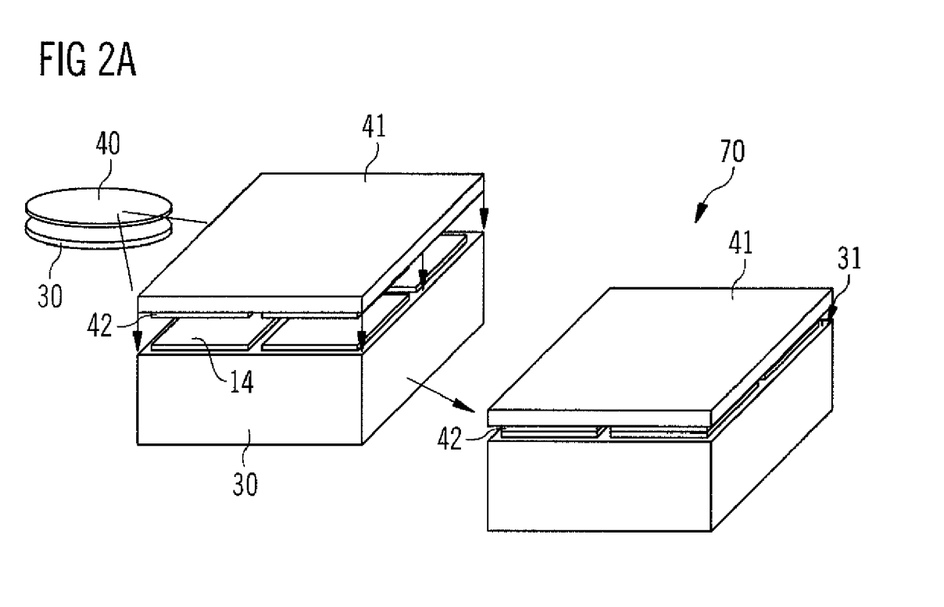
FIGS. 2A to 2D show, in schematic perspective illustrations, a second exemplary embodiment of a method for producing a multiplicity of semiconductor lasers described here.
Figure 2B:
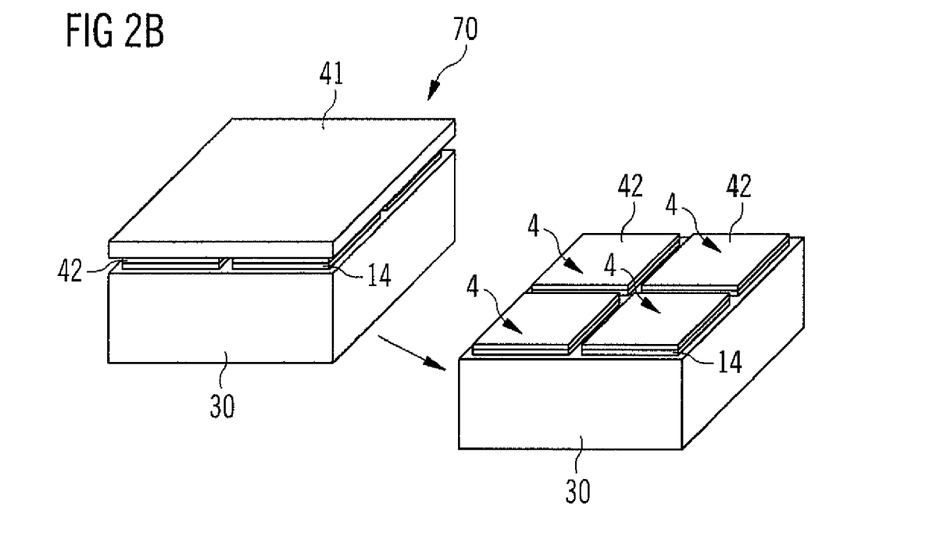

A second exemplary embodiment of a method for producing a multiplicity of semiconductor lasers described here is described on the basis of schematic perspective illustrations in conjunction with FIGS. 2A to 2D. FIG. 2A shows, in a schematic perspective illustration, a first method step of this method. In contrast to the method step described in conjunction with FIG. 1B, in this exemplary embodiment a wafer assembly 40 comprising semiconductor laser chips 4 is applied by its surface remote from the growth substrate 41 to the top side 31—provided with contact metallizations 14 of a carrier wafer 30. In this case, the semiconductor laser chips 4 are so-called "bottom emitter" structures. The wafer assembly 40 is provided with a soldering metallization on its surface facing the carrier wafer 30, said soldering metallization being soldered or bonded onto the contact metallization 14 of the carrier wafer. In this case, the contact metallization 14, as can be seen from FIG. 2A, can have a structuring with separating regions between contact areas in order to facilitate the subsequent singulation of the assembly 70 comprising wafer assembly 40 and carrier wafer 30.

In a subsequent method step, the growth substrate 41 is removed for example by selective wet or dry etching. Furthermore, between the individual semiconductor laser chips 4, a mesa etch is carried out in order to produce separating regions and an antireflective passivation layer is subsequently applied to that side of the semiconductor laser chips 4 which is remote from the carrier wafer 30, FIG. 2B. In this case, as an alternative, the production of the mesa structures can already be effected before wafer assembly 40 and carrier wafer 30 are connected to form an assembly 70.

Figure 2C:
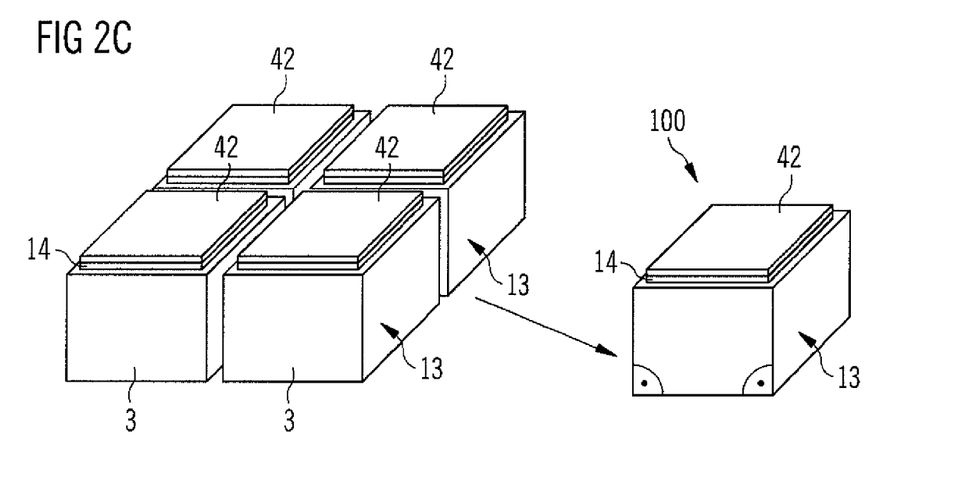
Figure 2D:
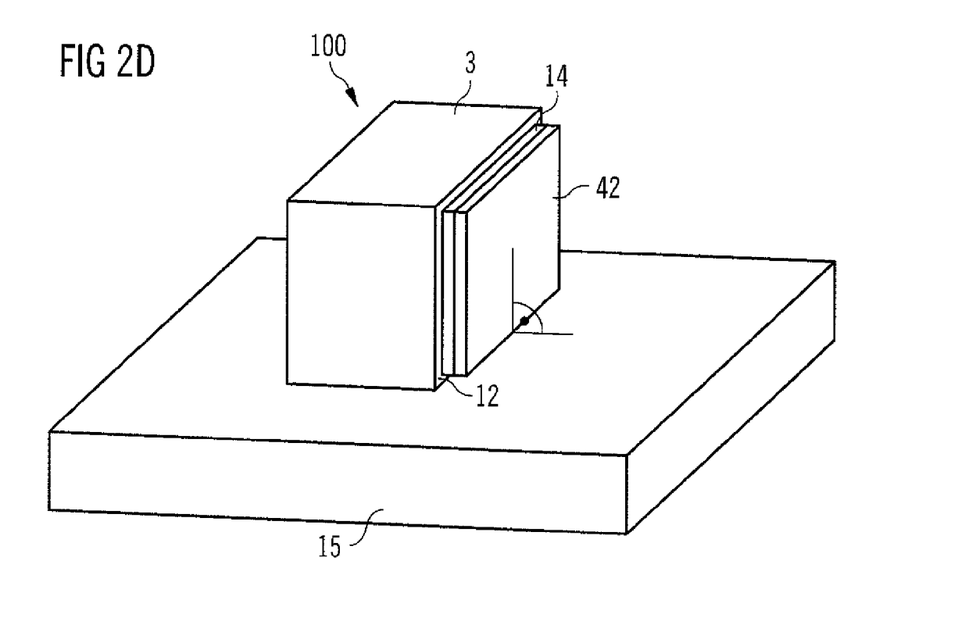

In the final method steps described in conjunction with FIGS. 2C and 2D, the assembly, as described in conjunction with FIGS. 1C and 1D, is singulated and individual semiconductor lasers 100 are mounted onto module carriers 15.

Figure 3A:
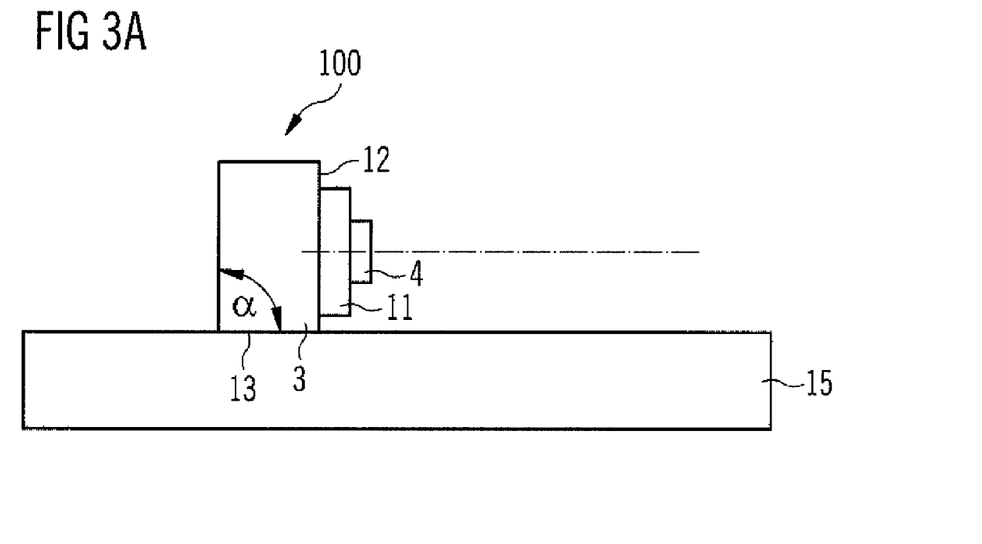
FIGS. 3A and 3B show an exemplary embodiment of a semiconductor laser described here.
Figure 3B:
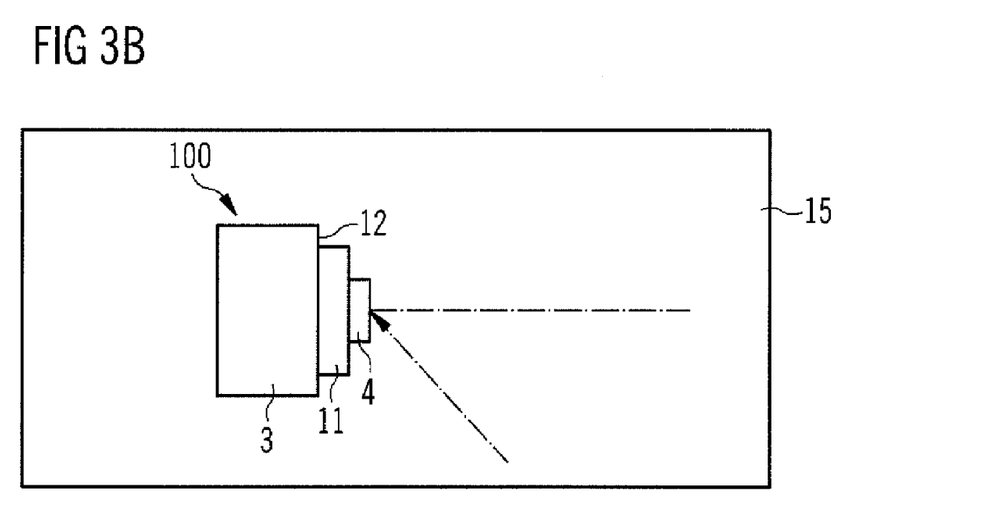

A further semiconductor laser device described here is described in conjunction with FIGS. 3A and 3B. In this case, FIG. 3A shows a schematic sectional illustration and FIG. 3B shows a schematic plan view of the semiconductor laser. In contrast to the semiconductor lasers described in conjunction with FIGS. 1D and 2D, in this exemplary embodiment a heat sink 11 is arranged between the mounting block 3 and the semiconductor laser chip 4, said heat sink improving the heat dissipation from the semiconductor laser chip 4 toward the mounting block 3 during operation of the semiconductor laser 100. In this case, the heat sink is applied to the carrier wafer 30 prior to the application of the semiconductor laser chips 4 and is fixed there. In this case, the heat sink 11 can be applied to the carrier wafer 30 as a wafer in an assembly or individually.

Furthermore, in the exemplary embodiments of the method for producing a multiplicity of semiconductor lasers as described in conjunction with FIGS. 1A to 1D and 2A to 2D, it is also possible for the semiconductor laser chips 4 to be applied to the carrier wafer 30 individually rather than in the wafer assembly 40. The advantage that the multiplicity of semiconductor laser chips can be produced in the panel remains in this case, too. Furthermore, in this case, too, a particularly planar mounting area is produced by the singulation of the carrier wafer 30, which mounting area runs substantially perpendicular to the top side 12 of the mounting block 3.

Figure 4A:
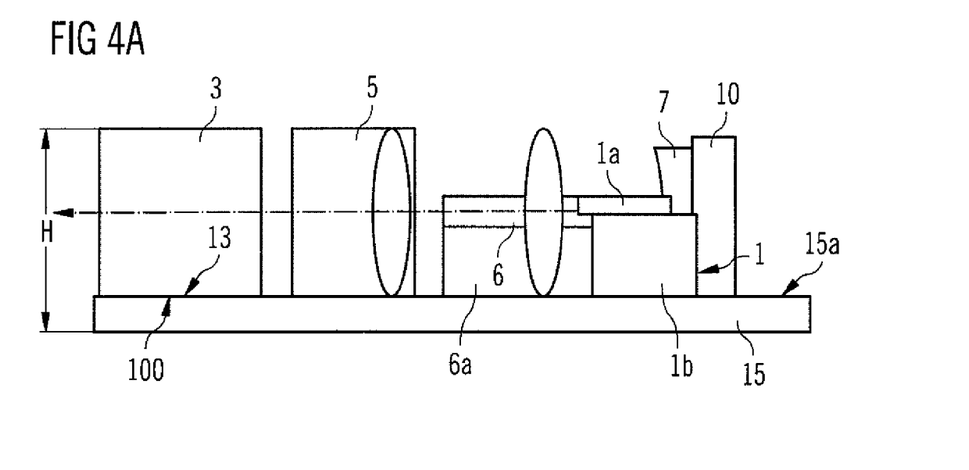
FIGS. 4A to 4C show a possible use of a semiconductor laser described here in a semiconductor laser module.
Figure 4B:
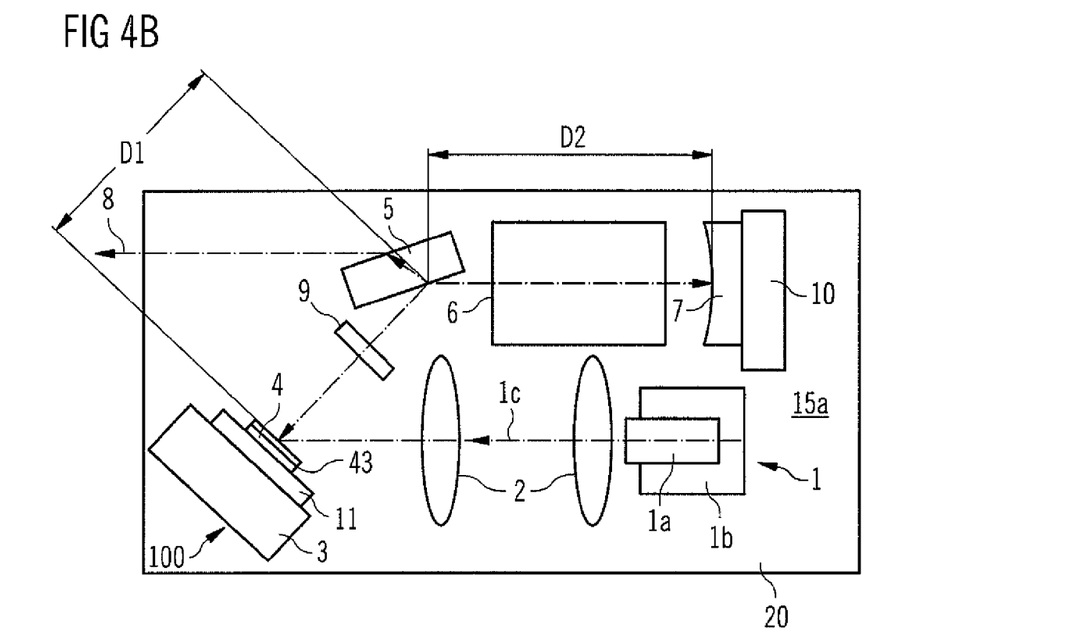
Figure 4C:
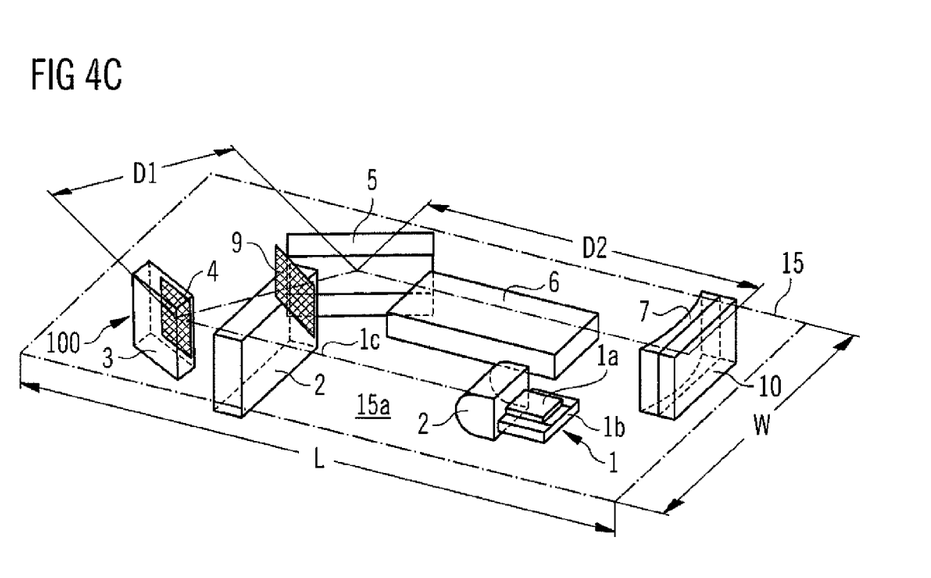

The use of a semiconductor laser described here in a semiconductor laser module is explained in more detail with reference to FIGS. 4A to 4C. FIG. 4A shows the semiconductor laser module in accordance with the first exemplary embodiment in a schematic side view. FIG. 4B shows the semiconductor laser module in a schematic plan view. FIG. 4C shows the semiconductor laser module in a schematic perspective illustration. The semiconductor laser module comprises a module carrier 15. The module carrier 15 is a board consisting of direct bonded copper (DBC), for example. Furthermore, it is possible for the module carrier to have a basic body composed of a ceramic material, such as aluminum nitride (AlN), which has at top side and underside metallizations which, for example, consist of copper and have a thickness of between 0.1 and 0.3 mm, preferably 0.2 mm. Furthermore, the module carrier can contain or consist of silicon.

The module carrier 15 has a mounting area 15a formed by the top side of the module carrier 15. The mounting area of the module carrier 15 is preferably at most 150 mm$^2$, particularly preferably at most 100 mm$^2$. By way of example, the mounting area 15a has a length L of 11 mm and a width W of 6 mm.

The components of the semiconductor laser module are applied to the mounting area 15a. By way of example, a pump device 1 is applied to the mounting area 15a. The pump device 1 comprises a pump source 1a and a heat sink 1b. The pump source 1a is fixed on that side of the heat sink 1b which is remote from the mounting area 15a. The heat sink 1b is applied, for example soldered or adhesively bonded, onto the mounting area 15a by that side of said heat sink which is remote from the pump source 1a. The pump source 1a generates highly divergent pump light. The pump source 1a is for example an edge emitting semiconductor laser such as a broad stripe laser having at least one emitter region. Pump radiation generated by the pump source during operation is focused onto the semiconductor laser chip 4 by the pump optics 2.

The semiconductor laser chip 4 is part of the semiconductor laser 100 as explained in more detail in conjunction with FIGS. 1A to 1D, 2A to 2C or 3A, 3B. The semiconductor laser 100 comprises a mounting block 3, which is fixed, for example soldered or adhesively bonded, with its mounting areas 13 on the mounting area 15a of the module carrier 15. The pump radiation 1c is focused onto the semiconductor laser chip 4 by the pump optical system 2 in such a way that a pump spot having a radius of between approximately 25 μm and at most 60 μm is generated there. The semiconductor laser chip 4 is a surface emitting semiconductor laser chip (VECSEL) which is optically pumped by the pump source 1a. During operation of the semiconductor laser chip 4, the heat flow takes place through the mounting block 3 toward the module carrier 15.

The resonator of the semiconductor laser module is defined by a Bragg mirror 43 of the semiconductor laser chip 4 and the end mirror 7. In this case, the reflective surface of the end mirror 7 comprises a coating that is highly reflective to the electromagnetic radiation having the fundamental wavelength that is generated by the semiconductor laser chip, and a coating that is highly reflective to the electromagnetic radiation that is converted in wavelength by the frequency conversion device 6. In this case, the semiconductor laser chip 4 generates for example electromagnetic radiation in the spectral range for infrared radiation, which is converted by the frequency conversion device 6 to form electromagnetic radiation in the spectral range of green light. By way of example, the pump light has a wavelength of 808 nm, the semiconductor laser chip 4 generates radiation having the wavelength of 1060 nm, and the frequency conversion device 6 generates radiation having the wavelength of 530 nm.

The semiconductor laser module has a height H of at most 3.5 mm, preferably at most 3 mm, particularly preferably at most 2.5 mm. In this case, the height H is the distance from the underside of the module carrier 15, remote from the mounting area 15a, to the highest point of the semiconductor laser module, formed for example by a component of the semiconductor laser module such as the semiconductor laser 100.

The resonator has a length D1 plus D2 of at most 10 mm.

A wavelength-selective element, for example an etalon 9, is arranged in the resonator. Furthermore, the frequency conversion device 6 is arranged in the resonator, said frequency conversion device comprising an optically nonlinear crystal. Furthermore, the frequency conversion device 6 can comprise a heating device 6a arranged between the optically nonlinear crystal and the module carrier 15 on the mounting area 15a.

The frequency-converted laser radiation 8—that is to say the green laser radiation, for example—is coupled out by the coupling-out unit 5, which simultaneously serves as a folding mirror for polarization selection. The coupling-out unit 5 has a coating that is highly reflective to electromagnetic radiation having the fundamental wavelength. Furthermore, the coupling-out unit 5 has a coating embodied as antireflective to frequency-converted radiation. In this way, electromagnetic radiation having the fundamental wavelength is kept in the resonator, whereas frequency-converted radiation 8 can leave the semiconductor laser module through the coupling-out unit 5. In the present exemplary embodiment, the coupling-out unit 5 is embodied as a plane mirror for the electromagnetic radiation having the fundamental wavelength.

In the exemplary embodiment described in conjunction with FIGS. 4A to 4C, the end mirror 7 is arranged on a mirror mounting block 10, which can consist for example of silicon, glass or aluminum nitride. The mirror mounting block is optional in this case.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

We claim:

1. A method for producing a multiplicity of semiconductor lasers comprising the steps of:
   a) providing a carrier wafer;
   b) producing an assembly by applying a multiplicity of semiconductor laser chips to a top side of the carrier wafer; and
   c) singulating the assembly to form a multiplicity of semiconductor lasers;
   wherein each semiconductor laser comprises a mounting block and at least one semiconductor laser chip,
   wherein each mounting block has a mounting area which runs substantially perpendicular to a top side of the mounting block, on which top side the semiconductor laser chip is arranged,
   wherein the mounting area is produced during the singulation of the assembly, and
   each mounting block is mounted by its mounting area onto a module carrier.

2. The method as claimed in the claim 1, wherein the carrier wafer contains one of the following materials or consists of one of the following materials: semiconductor material, ceramic material.

3. The method as claimed in claim 1, wherein the semiconductor chips are applied individually to the top side of the carrier wafer in method step b).

4. The method as claimed in claim 1, wherein the semiconductor chips are applied to the top side of the carrier wafer in the wafer assembly in method step b).

5. The method as claimed in claim 4, wherein a growth substrate is removed from the semiconductor laser chips after method step b).

6. The method as claimed in claim 1, wherein before method step b), for each semiconductor laser chip, a contact metallization is applied to the top side of the carrier wafer.

7. The method as claimed in claim 1, wherein before method step b), for each semiconductor laser chip, a heat sink is applied to the top side of the carrier wafer.

8. A semiconductor laser module comprising:
   a mounting block, having a top side and a mounting area;
   at least one semiconductor laser chip arranged on the top side of the mounting block; and
   a module carrier,
   wherein the mounting area runs substantially perpendicular to the top side of the mounting block; the mounting area is produced by a singulation process and said mounting block is mounted by it mounting area onto said module carrier.

9. The semiconductor laser as claimed in claim 8, wherein the mounting block contains one of the following materials or consists of one of the following materials: semiconductor material, ceramic material.

10. The semiconductor laser as claimed in claim 8, wherein the mounting block has a substantially uniform thickness of at least 0.5 mm and at most 1.7mm.

11. The method of claim 1, wherein the carrier wafer comprises is silicon.

12. The method of claim 1, wherein the carrier wafer comprises aluminum nitride.

13. The semiconductor laser as claimed in claim 8, wherein the mounting block comprises silicon.

14. The semiconductor laser as claimed in claim 8, wherein the mounting block comprises aluminum nitride.

15. The method of claim 1, wherein the semiconductor laser chip comprises an optically pumpable surface emitting semiconductor laser chip.

16. The semiconductor laser as claimed in claim 8, wherein the semiconductor laser chip comprises an optically pumpable surface emitting semiconductor laser chip, and a pump device is applied to a mounting area of the module carrier and a pump radiation produced by the pump device is focused onto the semiconductor laser chip.

* * * * *